United States Patent

[11] 3,566,003

[72] Inventor Joseph Wislocky
El Segundo, Calif.
[21] Appl. No. 700,090
[22] Filed Jan. 24, 1968
[45] Patented Feb. 23, 1971
[73] Assignee International Rectifier Corporation
El Segundo, Calif.

[54] PLUG-IN DIODE HAVING CONDUCTIVE METALLIC CAPS AND HOMOGENEOUS ENCAPSULATION MEDIUM
3 Claims, 2 Drawing Figs.

[52] U.S. Cl. ........ 174/52, 317/234, 317/235
[51] Int. Cl. ........ H01l 3/00, H01l 5/00
[50] Field of Search ........ 317/234, 3, 3.1, 4, 101; 39/220; 337/186, 187, 225; 174/52.6

[56] References Cited

UNITED STATES PATENTS

| | | | |
|---|---|---|---|
| 2,918,612 | 12/1959 | Parrish | 317/234 |
| 3,179,853 | 4/1965 | Kozacka | 317/100 |
| 3,454,841 | 7/1969 | Urba et al. | 317/234 |
| 2,847,624 | 8/1958 | Goldman | 317/236 |
| 3,424,852 | 1/1969 | Hauck et al. | 174/17.05 |
| 3,307,087 | 2/1967 | Rogers et al. | 317/234 |

FOREIGN PATENTS 1,519,206 France.

*Primary Examiner*—John W. Huckert
*Assistant Examiner*—Barry Estrin
*Attorney*—Ostrolenk, Faber, Gerb & Soffen

ABSTRACT: A standard diode having axial leads is encapsulated in a cylindrical plastic body. The ends of the plastic body receive respective ferrules connected to the respective leads so the unit can be plugged into spring clip terminals.

INVENTOR
JOSEPH WISLOCKY

BY

OSTROLENK, FABER, GERB & SOFFEN

ATTORNEYS

PLUG-IN DIODE HAVING CONDUCTIVE METALLIC CAPS AND HOMOGENEOUS ENCAPSULATION MEDIUM

This invention relates to rectifier units and is more particularly concerned with a molded plug-in diode and method for producing the same.

Electrical components including diodes are frequently required to be connected in electrical circuits in a simple manner, not requiring soldering, to permit easy installation and removal of the electrical components. Convenient electrical connection of this type is provided by the use of spring terminal clips such as fuse clips. The use of such fuse clips requires the manufacture of the electrical components such that the components may be plugged into the fuse clips to provide adequate electrical connections between the terminals of the components and the electrical conductors of the fuse clips. It is also necessary that the electrical components be constructed to have adequate physical strength for the insertion and removal of the component.

In the past, diodes have been constructed as plug-in type units for use in fuse clip-type connections, as described above. However, the previous rectifier plug-in units have been expensive because of the large number of parts required for the manufacture of each unit and because of the many handling operations necessary for the production of each unit. In addition, the electrical characteristics of these previous units were not completely satisfactory in that they were not moisture resistant and their voltage ratings were limited.

One previous plug-in type rectifier unit consists of a semiconductor device enclosed in a ceramic tube having metal caps soldered to the ends of the ceramic tube. The ceramic tube of this type of rectifier unit is highly susceptible to breakage.

Other previous method of manufacturing plug-in type rectifier units consist of mounting semiconductor devices in a tube, sealing the tube at one end with a cap of exact dimensions, filling the tube with insulator material, sealing the second end of the tube with a second precision cap, and after additional processing, placing metal end caps on the tube and then sealing the metal end cap to the unit. Methods such as these require the use of numerous precision made parts and further require numerous handling operations.

The present invention overcomes the problems of the prior art and provides a novel molded plug-in type rectifier unit and novel method for producing the same. In particular, in one preferred embodiment of the invention, the rectifier unit consists of a standard semiconductor device having a pair of leads axially extending therefrom. The semiconductor device and the leads are then surrounded by a homogeneous insulation cylinder. The leads extend to metal caps or ferrules which are placed on opposite ends of the molded cylinder, and they are soldered to these ferrules and cut off so that they do not extend beyond the exterior surface of the ferrules. Then then forms a novel diode device which can be connected in a circuit by fuse clips which is sturdy and moistureproof due to the solid encapsulating cylinder.

Therefore, the primary object of this invention is to provide a plug-in electrical unit which is easily manufactured and requires a minimum number of parts.

It is another object of this invention to provide a plug-in diode unit which is durable and has great physical strength.

Another object of this invention is to provide a semiconductor rectifier unit which is unaffected by environmental conditions such as humidity, temperature, etc.

A further object of this invention is to provide a plug-in semiconductor device which may be used in high voltage circuits.

The above objects and features of the instant invention, along with others, will become apparent upon reading the following description of the invention in conjunction with the drawings as follows.

Figure 1:
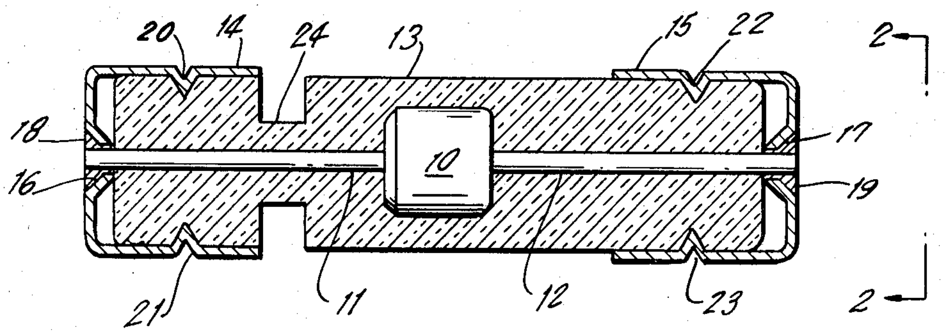
FIG. 1 is a longitudinal cross-sectional view of a plug-in diode constructed in accordance with the instant invention.
Figure 2:
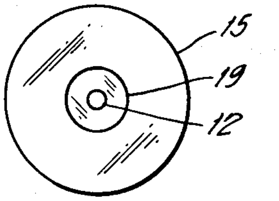
FIG. 2 is an end view of FIG. 1.

Referring to the drawings, there is shown a sealed semiconductor unit 10. The sealed semiconductor unit 10 may consist of a wafer of silicon with a single junction to form a diode, surrounded by potting material such as epoxy molding compound. A typical sealed semiconductor unit which may be used in the instant invention is shown in applicant's U.S. Pat. No. 3,274,457, entitled "Semiconductor Encapsulated and Sealed Within Housing," and assigned to the assignee of the instant invention. The semiconductor unit 10 has a pair of axial leads 11 and 12 extending therefrom.

In accordance with the invention, the semiconductor unit 10 and the leads 11 and 12 are embedded in a homogeneous insulation cylinder 13. Leads 11 and 12 extend beyond the ends of cylinder 13.

A pair of inexpensive metal caps or ferrules 14 and 15 fit over the opposite ends of the insulating body 13 of the rectifier unit. The ferrules 14 and 15 are provided with central indented openings 16 and 17, respectively, which receive leads 11 and 12, respectively. The central portion of the ferrules 14 and 15 are indented so that the leads 11 and 12 may be securely soldered to the ferrules by solder masses 18 and 19 situated within the indentations.

The ferrules 14 and 15 are secured with insulating body 13 by punched indentations 20 and 21 and 22 and 23, respectively, which engage the outer surface of cylinder 13.

The plug-in unit of the instant invention may further be molded with an offcenter groove 24 in the insulating body 13. The groove 24 may be employed for the purpose of indicating the polarity of the ferrules 14 and 15 for proper insertion of the rectifier unit in an electrical circuit. Obviously, other polarity markings may be employed.

In the manufacture of the plug-in unit of the invention, a sealed semiconductor device 10 having leads 11 and 12 axially extending therefrom for a suitable length is placed in a mold, with the leads 11 and 12 extending along the axial length of the mold. The insulating material 13 is then molded around the semiconductor device 10 and leads 11 and 12, permitting a sufficient length of the leads 11 and 12 to extend from the material. After the molding operation, two inexpensive drawn ferrules 14 and 15 are placed on the insulating body 13, with the leads 11 and 12 extending through the ferrules 14 and 15. The leads 11 and 12 are then cut flush with the ferrule end surface, and are soldered to the ferrules 14 and 15. The ferrules 14 and 15 may then be punched at suitable locations such as 20 and 21, and 22 and 23, respectively, to secure the ferrules to the insulating body 13. If desired, the ferrules may be punched before the soldering operation.

As can be seen from the above, the device of the invention consists of few parts which may be made of inexpensive material. Moreover, the manufacturing process does not contain critical steps. Clearly, the number of handling operations in the manufacture of the unit of the invention are few.

It can be further seen from the above description of the instant invention that the unit produced by the invention is highly resistant to moisture and other environmental conditions, since the semiconductor device is doubly sealed, with sealed unit 10 having an additional insulating body 13 surrounding the unit 10 and extending a substantial distance along the leads 11 and 12 of the unit.

The rectifier unit of the instant invention may also be used in higher voltage circuits due to the extended creepage path caused by the extended insulating body 13 of the unit.

The rectifier unit of the instant invention may be employed in electrical circuits where it is necessary to have a rectifier which may be inserted and removed conveniently. In employing the rectifier unit of the instant invention in an electrical circuit, it is merely necessary to insert the ferrules 14 and 15 in suitable spring terminal clips of the electrical circuit. Since the groove 24 indicates the polarity of the ferrules 14 and 15, it is only necessary to make sure that these terminals are inserted in the proper spring terminal clips. It is also possible to have the spring terminal clips manufacture such that the ferrules 14 and 15 may only be inserted in the proper polarity as a result of the location of the groove 24.

While the rectifier unit of the instant invention and the method for manufacturing the same has been described with respect to one embodiment thereof, many modifications, and variations will now be obvious to those skilled in the art, and it is preferred, therefore, that the scope of the invention be limited not by the specific disclosure herein, but only by the appended claims.

I claim:

1. A molded plug-in type electrical device comprising:

a sealed semiconductor device having first and second conductive leads extending therefrom and extending axially in opposite directions and along a common axis;

a homogeneous molded elongated body of insulating material surrounding said sealed semiconductor device and in contact with the full surface area of said sealed device;

said homogeneous molded elongated body extending axially along substantially the full length of said first and second conductive leads and in contact with the full peripheral surface of said first and second leads;

first and second metallic caps secured to and surrounding the opposite ends of said homogeneous molded elongated body;

first metallic cap electrically connected to said first conductive lead;

said second metallic cap electrically connected to said second conductive lead;

the ends of said first and second metallic caps each having central inwardly indented portions and openings located in each of said indented portions; said first and second conductive leads extending through said openings in said first and second metallic caps, respectively; and first and second solder masses in said indented portions of said first and second metallic caps connecting said first and second conductive leads to said first and second metallic caps, respectively; said first and second conductive leads terminating at the outer surface of said first and second metallic caps, respectively.

2. The rectifier unit as set forth in claim 1 further including means for identifying the polarity of said device.

3. The rectifier units set forth in claim 4 wherein said sealed semiconductor device comprises a diode, and wherein said homogeneous molded elongated body is cylindrically shaped; said first and second metallic caps defining first and second ferrules, respectively, located at opposite ends of said cylindrically shaped molded elongated body.